United States Patent [19]

Katayama et al.

[11] 3,900,881

[45] Aug. 19, 1975

[54] NEGATIVE RESISTANCE DEVICE AND METHOD OF CONTROLLING THE OPERATION

[75] Inventors: Yoshifumi Katayama, Hachioji; Nobuo Kotera, Kokubunji; Yoshimasa Murayama, Kodaira; Isao Yoshida, Hachioji, all of Japan

[73] Assignee: Hitachi, Ltd., Tokyo, Japan

[22] Filed: Aug. 18, 1971

[21] Appl. No.: 172,773

[30] Foreign Application Priority Data

Aug. 19, 1970 Japan .................. 45-72038
Mar. 5, 1971 Japan .................. 46-11265

[52] U.S. Cl. .................. 357/3; 331/107 G; 357/1; 357/4; 357/23; 357/27

[51] Int. Cl. .................. H01l 3/12; H03b 15/00

[58] Field of Search .................. 317/234 V, 235 B; 331/107 G; 357/1, 3, 27

[56] References Cited

UNITED STATES PATENTS

| | | | |
|---|---|---|---|
| 3,215,862 | 11/1965 | Erlbach | 317/234 V |
| 3,365,583 | 1/1968 | Gunn | 317/234 V |
| 3,365,677 | 1/1968 | Komatsubara | 317/234 V |
| 3,407,343 | 10/1968 | Fang | 317/234 V |
| 3,435,307 | 3/1969 | Landauer | 317/234 V |
| 3,458,832 | 7/1969 | McGroddy et al. | 317/234 V |
| 3,469,208 | 9/1969 | Komatsubara | 317/234 V |
| 3,516,019 | 6/1970 | Kroemer et al. | 317/234 V |
| 3,555,444 | 1/1971 | Hines | 317/234 V |
| 3,571,593 | 3/1971 | Komatsubara | 317/234 V |
| 3,588,736 | 6/1971 | McGroddy | 317/234 V |
| 3,626,328 | 12/1971 | Esaki et al. | 331/107 G |
| 3,634,780 | 1/1972 | Bosch et al. | 317/234 V |
| 3,676,795 | 7/1972 | Pratt, Jr. | 357/3 |

OTHER PUBLICATIONS

Stern et al., Phys. Rev., Vol. 163, No. 3, 15 Nov. 1967, pp. 816–835.

Hall et al., IBM Tech. Discl. Bull., Vol. 8, No. 4, pp. 651–652, (Sept. 1965).

McGroddy, "Current Oscillations . . . ," IEEE Trans. on Electron Devices, Vol. ED–17, No. 3, Mar. 1970, pp. 207–213.

Ridley et al., Proc. Phys. Soc., (London), "Possibility of Negative Resistance," Vol. 78, pp. 293–303, (Aug. 1961).

Larrabee et al., "The Oscillistor . . . ," J. Appl. Phys. 31, 1519 (1960), Vol. 31, No. 9, pp. 1,519–1,523, Sept. 1960.

*Primary Examiner*—William D. Larkins
*Attorney, Agent, or Firm*—Craig & Antonelli

[57] ABSTRACT

A negative resistance device and method of controlling the operation characteristics thereof in which the momentum-energy dispersion relation of a material having a multi-valley structure is quantized by an external expedient to provoke the material to a negative resistance characteristic and to make the negative resistance characteristic controllable.

7 Claims, 24 Drawing Figures

INVENTORS
YOSHIFUMI KATAYAMA,
NOBUO KOTERA,
YOSHIMASA MURAYAMA AND
ISAO YOSHIDA
BY Craig, Antonelli & Hill
ATTORNEYS INVENTORS
YOSHIFUMI KATAYAMA,
NOBUO KOTERA,
YOSHIMASA MURAYAMA AND
ISAO YOSHIDA
BY Craig, Antonelli & Hill
ATTORNEYS

INVENTORS
YOSHIFUMI KATAYAMA,
NOBUO KOTERA,
YOSHIMASA MURAYAMA AND
ISAO YOSHIDA

BY Craig, Antonelli & Hill
ATTORNEYS

INVENTORS

YOSHIFUMI KATAYAMA,
NOBUO KOTERA,
YOSHIMASA MURAYAMA AND
ISAO YOSHIDA

BY Craig, Antonelli & Hill
ATTORNEYS

INVENTORS

YOSHIFUMI KATAYAMA,
NOBUO KOTERA,
YOSHIMASA MURAYAMA AND
ISAO YOSHIDA

BY Craig, Antonelli & Hill
ATTORNEYS

INVENTORS

YOSHIFUMI KATAYAMA,
NOBUO KOTERA,
YOSHIMASA MURAYAMA AND
ISAO YOSHIDA

BY Craig, Antonelli & Hill
ATTORNEYS

PATENTED AUG 1 9 1975 Sheet 7 11 3 900,881

INVENTORS

YOSHIFUMI KATAYAMA,
NOBUO KOTERA,
YOSHIMASA MURAYAMA AND
ISAO YOSHIDA

BY Craig, Antonelli & Hill
ATTORNEYS

INVENTORS
YOSHIFUMI KATAYAMA,
NOBUO KOTERA,
YOSHIMASA MURAYAMA AND
ISAO YOSHIDA
BY Craig, Antonelli & Hill
ATTORNEYS INVENTORS
YOSHIFUMI KATAYAMA,
NOBUO KOTERA,
YOSHIMASA MURAYAMA AND
ISAO YOSHIDA
BY Craig, Antonelli & Hill
ATTORNEYS

INVENTORS

YOSHIFUMI KATAYAMA,
NOBUO KOTERA,
YOSHIMASA MURAYAMA AND
ISAO YOSHIDA

BY Craig, Antonelli & Hill
ATTORNEYS

INVENTORS
YOSHIFUMI KATAYAMA,
NOBUO KOTERA,
YOSHIMASA MURAYAMA AND
ISAO YOSHIDA
BY Craig, Antonelli & Hill
ATTORNEYS

NEGATIVE RESISTANCE DEVICE AND METHOD OF CONTROLLING THE OPERATION

BACKGROUND OF THE INVENTION

1. Field of the Invention

The present invention relates to a negative resistance device and method of controlling the operation characteristics of the same, in which there is utilized a material having a plurality of momentum-energy dispersion relations, namely a material involving multi-valleys in its energy band structure.

2. Description of the Prior Art

In general, the motion of an electron, which can move about freely in the three-dimensional space in a crystal without any restriction with respect to the boundary condition, can be described by a dispersion relation connecting the momentum and the energy, both being characteristic of the material in question. According to Ridley and Watkins, who contributed to "Proceeding of Physical Society (London)," Vol. 78, 1961,

293, published by the British Physical Society, the following facts were theoretically verified. Namely, in a material involving a plurality of momentum-energy dispersion relations, some dispersion relations having a higher mobility $\mu_H$ correspond to low-energy valleys, while the other dispersion relations having a lower mobility $\mu_L$ are associated with high-energy valleys. If the separation $\Delta$ of the bottom of the high-energy valley from the low-energy valley is sufficiently large in comparison with the ambient temperature of the material, an electron in the low-energy band can be excited into the hot electron state or high-energy band in the existence of an electric field E approximately equal to or less than $10^6$ V/cm. Thus, the behavior of the electron excited up to the hot electron state is that of conduction electron in the conduction band which is in the higher energy level, having a low mobility. Consequently, the voltage-current characteristic of the material will exhibit a negative resistance property. Gunn is the person who experimentally observed that if an electric field higher in intensity than a certain threshold value is applied between the electrodes disposed on the opposite sides of a bulk of n-type gallium arsenide, the current-voltage characteristic follows an N-shape negative resistance curve. This phenomenon occurs because GaAs has two or more conduction bands in which the mobility of an electron takes different values so that if the GaAs bulk is placed in an electric field intenser than a threshold one then electrons are excited from conduction bands with higher mobility up to those with lower mobility, the higher and lower mobilities being respectively depicted by $\mu_L$ (its effective mass is $m^*_L$) and $\mu_H$ (its effective mass is $m^*_H$).

However, according to the method proposed by Gunn, only one kind of negative resistance characteristic can be developed in the material, that is, the characteristic is fixed one and proper to the material. Thus, it was impossible to control or somewhat change the resulted characteristic.

According to the present invention, the negative resistance characteristic is obtained by making the separation $\Delta$ of the bottom of the high-energy valley from the low-energy valley sufficiently great relative to the ambient temperature of the material which involves a plurality of momentum-energy dispersion relations and in which the mobility of electron $\mu_L$ in the lower energy band is high while the mobility $\mu_H$ in the higher energy band is low.

The negative resistance characteristic achieved according to the invention can be controlled to an appreciable degree by adjusting the dimension of the separation $\Delta$. Namely, the negative resistance characteristic is obtained by quantizing the dispersion relations to turn nondegenerate the initially degenerate valleys and by grouping the valleys into quantized levels to make the mobility of electron $\mu_L$ in the lower energy bands high and the mobility $\mu_H$ in the higher energy bands low. More particularly, the present invention provides an element which has negative resistance characteristics by splitting each valley into sub-bands and transferring carriers from higher mobility and lower energy sub-bands into lower mobility and higher energy sub-bands among the valleys.

SUMMARY OF THE INVENTION

An object of this invention is to provide a negative resistance element which is capable of easily providing negative resistance properties.

Another object of the present invention is to provide a negative resistance device whose negative resistance characteristic can be controlled.

According to the present invention that has been made to attain the aforementioned object, a bulk is used which involves a plurality of momentum-energy dispersion relations and which has many valleys of equivalent structure, the momentum-energy dispersion relations of which are quantized with the aid of an external influence so that the bulk is endowed with the negative resistance characteristic, and the characteristic is controlled by controlling the external influence.

Materials which involve plural momentum-energy dispersion relations are those having multi valley structures, that is, semiconductors and semi-metals such as Ge, Si, GaAs, etc.

As the external influence, i.e. the means utilized to quantize the momentum-energy dispersion relations, there may be an electric field, a magnetic field, or a geometrical restriction imposed upon the motion of the electron in the one-dimensional direction.

It will next be described how the quantization is effected in the case of electrons contributing to conduction in a semiconductor, for example. It is, of course, needless to say that a semi-metal may be employed instead of the semiconductor and that electric charge carriers to be subjected to quantization are not limited to electrons, but positive holes in the valence band can be subjected likewise.

Typical semiconductors having a multi valley structure are Ge and Si, as previously mentioned. In germanium or silicon, described in terms of momentum space (i.e. wave vector k space or pseudomomentum space) there are several constant-energy surfaces, each being in the form of an ellipsoid of revolution, located at several mutually equivalent points in the vicinity of the bottom of the conduction band. Let it be assumed that $x$, $y$ and $z$ axes are selected such that the $z$ axis coincides with the axis of revolution of one of the ellipsoids of revolution while the $x$ and $y$ axes are perpendicular to each other as well as to the $z$ axis. A Si bulk has six identical valleys (energy ellipsoids) in the six directions equivalent to the direction <100> in the momentum space $k$, as illustrated in FIG. 1$a$. On the other hand, a Ge bulk contains eight identical valleys (energy ellipsoids) in the eight directions equivalent to a direction <111>, as illustrated in FIG. 1*b*. As to such semiconductors as have multi-valley structures, one particular momentum-energy dispersion relation corresponds to each of the many valleys. For example, for the [100] valley of the Si bulk, the dispersion relation is $$E_k^{[100]} = \frac{\hbar^2}{2m_l}(K_x - K_{x0})^2 + \frac{\hbar^2}{2m_t}K_y^2 + \frac{\hbar^2}{2m_t}k_z^2$$

where $m_l$ is the effective mass equal to 0.98m$_o$ ($m_o$ is the mass of an electron in vacuum) in the longitudinal direction of the ellipsoid of revolution corresponding to the valley; $m_t$ the effective mass equal to 0.19m$_o$ and in the traverse direction of the ellipsoid; $\hbar$ Planck's constant $h$, divided by $2\pi$; $\hbar k$ the momentum; $k_x$, $k_y$, and $k_z$ the components of $k$ respectively in the directions of the $x$, $y$, and $z$ axes in $k$ space; and $k_{x0}$ is about $1.7\pi/a_o$ ($a_o$ is the lattice constant of the silicon crystal), representing the center point of the ellipsoid of revolution.

I. If an intense electric field is applied to the silicon bulk in a direction parallel to the [100] direction, the above dispersion relation will be changed to $$E_{n,F}^{[100]} = E_{n,F}' + \frac{\hbar^2}{2m_t}k_y^2 + \frac{\hbar^2}{2m_t}k_z^2,$$

this relation being different from that given for the silicon bulk.

In like manner, it follows that for the [010] valley $$E_{n,F}^{[010]}(k) = E_{n,F}' + \frac{\hbar^2}{2m_l}(k_y - k_{y0})^2 + \frac{\hbar^2}{2m_t}k_z^2$$

and that for the [001] valley $$E_{n,F}^{[001]}(k) = E_{n,F}' + \frac{\hbar^2}{2m_l}(k_z - k_{z0})^2 + \frac{\hbar^2}{2m_t}k_y^2.$$

In this case, the energy of the [100] valley and the [010], [001] valleys are respectively expressed by $E_{n,F}'$ and $E_{n,F}'$ such that $$E_{n,F}' \simeq \left(\frac{3hc\pi F}{2\sqrt{2m_l}}\right)^{2/3} \times \left(n + \frac{3}{4}\right)^{2/3} \quad \text{and}$$

$$E_{n,F}' \simeq \left(\frac{3hc\pi F}{2\sqrt{2m_t}}\right)^{2/3} \times \left(n + \frac{3}{4}\right)^{2/3}.$$

In the case of silicon Si, an inequality $m_l >> m_t$ holds. In most cases with semiconductors having multi-valley structure, a similar inequality $m_l >> m_t$ holds. FIG. 2 is a graphical representation of the momentum-energy dispersion relations associated with silicon. In the figure, the vertical axis E is an energy axis orthogonal to $k_y$ and $k_z$ axes which are orthogonal to each other.

II. The same is true of the quantization by a magnetic field. If a magnetic field B is applied to germanium in the [111] direction, the resulting momentum-energy dispersion relations are those for the [111] valley (the longitudinal and transverse effective masses $m_l$ and $m_t$ are such that $m_l = 1.58m_o$ and $m_t = 0.082m_o$), that is, $$E_{n,H}(k) = E_{n,H} + \frac{\hbar^2}{2m_l}k_1^2$$

where $k_1$ is the component of $k$ parallel to the direction [111], and $$E_{n,H} = \frac{\hbar eB}{m_t c}(n+½),$$

where $E_{n,H}$ is the energy quantized with respect to the transverse mass due to the application of the magnetic field.

The momentum-energy dispersion relation for the [T11] valley is given below:

$$E_{n,H}^{[\bar{1}11]}(k) = E_{n,H}' + \frac{\hbar^2}{2m_1}k_1^2$$

$$m_1 = \frac{9m_l m_t}{m_l + 8m_t},\quad m_2 = \frac{\sqrt{m_t(m_t + 8m_l)}}{3}$$

$$E_{n,H}' = \frac{\hbar eB}{m_2 c}(n+½)$$

In the above expression, $E_{n,H}'$ is the energy quantized with respect to the mass in the direction perpendicular to the direction [111].

FIG. 3*b* is the graphical representation of the structure of the energy bands in germanium, the quantization being due to a magnetic field. The abscissa $k_1$ is the axis taken perpendicular to the direction [111] and the ordinate E gives the measure of energy. It is readily known by reference to FIGS. 3*a* and 3*b* that the energy band structure as shown in FIG. 3*b* which is caused by the application of a magnetic field is different from that as shown in FIG. 3*a* which exists in the case of no magnetic field being applied.

III. The band structure of the electron energy characteristic of a semiconductor bulk can also be changed by quantizing the motion of the electrons under restriction on the geometry of the bulk. Namely, if a very thin film of single crystal configuration is formed on the [100] plane, the energies for the [100], [010] and [001] valleys are given respectively by $$E_{(k)}^{[100]} = E_{n,d}' + \frac{\hbar^2}{2m_t}k_y^2 + \frac{\hbar^2}{2m_t}k_z^2$$

$$E_{(k)}^{[010]} = E_{n,d}' + \frac{\hbar^2}{2m_l}(k_y - k_{y0})^2 + \frac{\hbar^2}{2m_t}k_z^2,\ \text{and}$$

$$E_{(k)}^{[001]} = E_{n,d}' + \frac{\hbar^2}{2m_t}k_y^2 + \frac{\hbar^2}{2m_l}(k_z - k_{z0})^2,$$

where $$E_{n,d}' = \frac{\hbar^2}{2m_l} \times \left(\frac{n\pi}{d}\right)^2 \quad \text{and}$$

$$E_{n,d}' = \frac{\hbar^2}{2m_t} \times \left(\frac{n\pi}{d}\right)^2.$$

The relation between momentum and energy in this case very much resembles that shown in FIG. 2.

IV. The examples of quantization as described above are taken for silicon and germanium in which the condition $m_l >> m_t$ is satisfied. However, the condition $m_l << m_t$ may hold in order to obtain the energy distribution as shown in FIGS. 2 and 3b.

As seen in the figures, the energy bands having high electron mobility are at a lower energy level, while the energy bands having low electron mobility are at a higher energy level. This is because the mobility varies directly as the relaxation time of electron diffusion and inversely as the effective mass (radius of curvature of the energy band near the bottom). It is also well known that the relaxation time will be shortened with the increase in energy. Therefore, it is probable that even when degeneracy still remains in the valleys as in case that the motion of electron in the direction [111] in a silicon crystal is quantized the mobility of higher energy band in a valley is lower than that of lower energy band in the same valley.

As a result, in order to obtain the negative resistance characteristic it is necessary:

1. To create electron bands having high mobility at a lower energy level and electron bands having low mobility at a higher energy level, and 2. To render the energy separation Δ between the high-mobility band and the low-mobility band sufficiently great in comparison with the thermal energy kT determined by the ambient temperature, to transfer charge carriers from lower energy sub-valleys to higher energy sub-valleys.

3. The way by which the negative resistance characteristic is obtained, due to such quantization as described above by satisfying the two requirements given just above, will next be explained through some embodiment of the present invention.

DESCRIPTION OF THE PREFERRED EMBODIMENTS

Embodiment 1

Figure 3A:
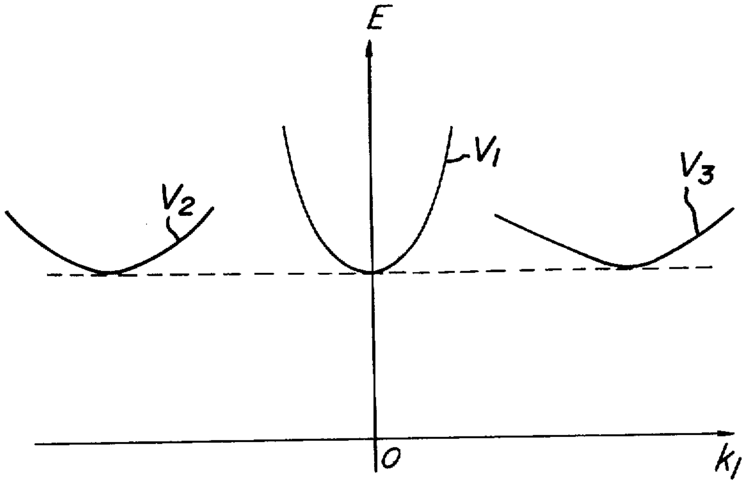
FIGS 3a and 3b show energy band structures of germanium bulk respectively before and after the application of a magnetic field.
Figure 3B:
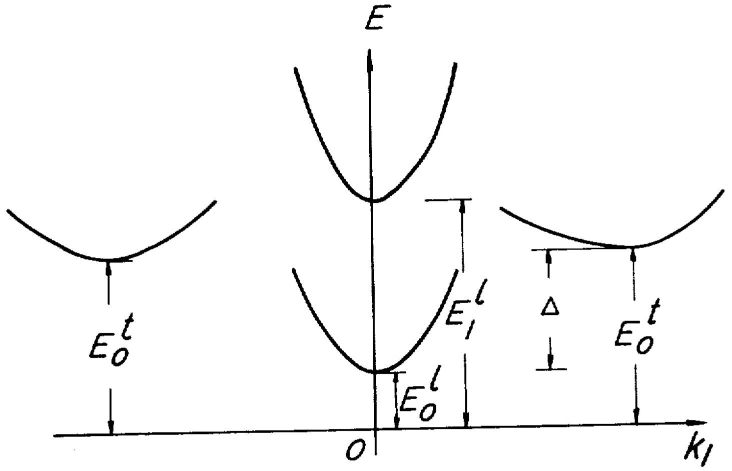
Figure 4A:
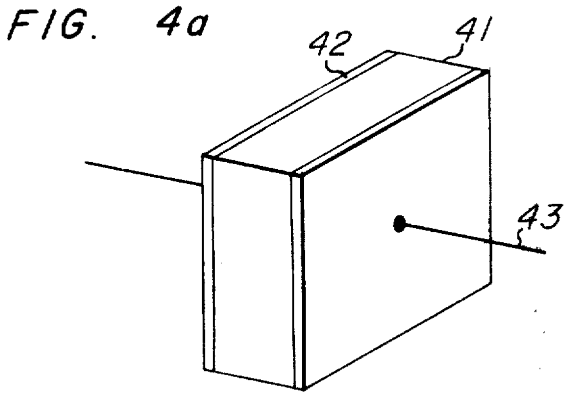
FIG. 4a shows a germanium bulk used in an embodiment of the invention.
Figure 4B:
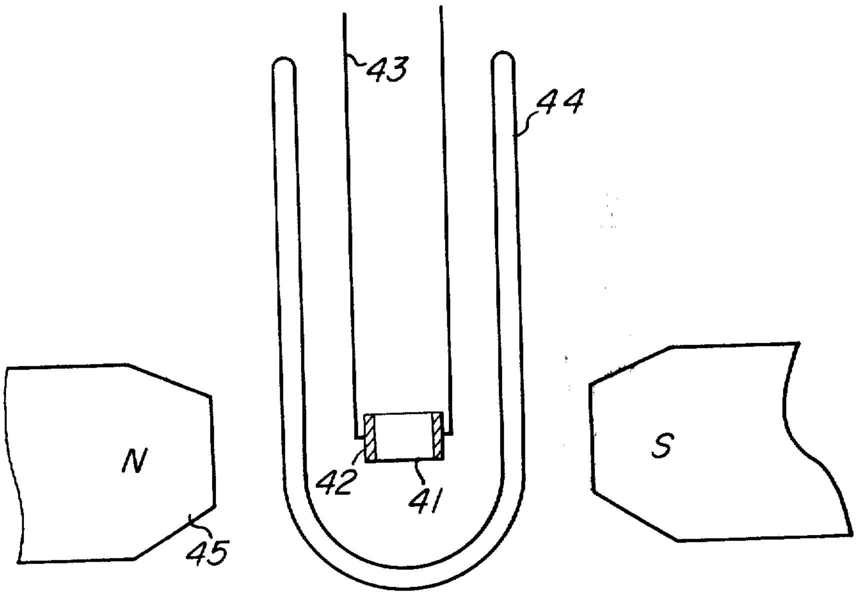
FIG. 4b depicts a mode of embodying the invention.
Figure 5:
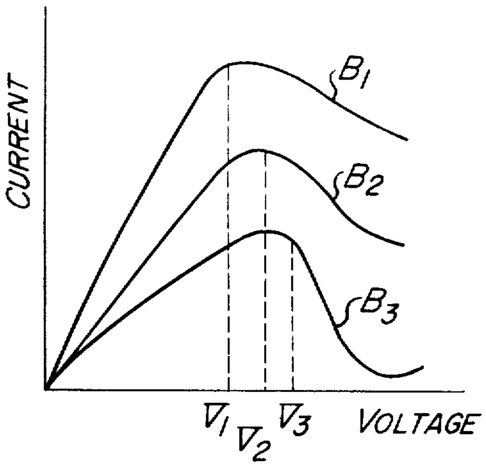
FIG. 5 shows current-voltage characteristics of the germanium bulk for various magnetic fields applied to the bulk.
Figure 6:
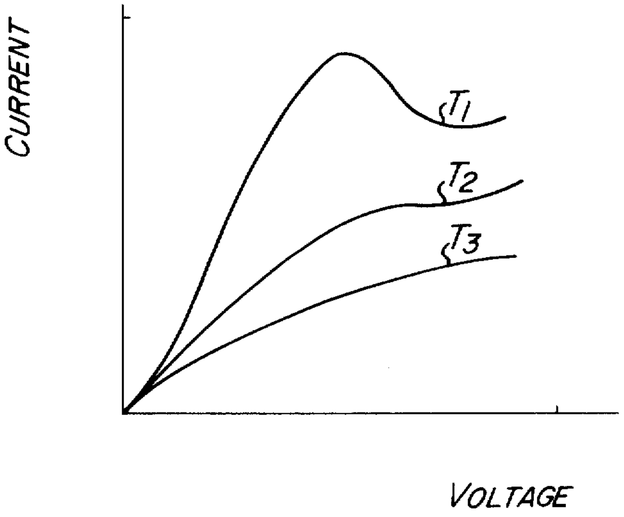
FIG. 6 shows current-voltage characteristics of the germanium bulk for various temperatures, in which the temperature dependence of the negative resistance characteristic is observed.

An n-type germanium bulk 41 having dimensions 1mm × 0.5 mm × 0.5 mm is prepared which is doped with impurities at a concentration of $10^{16}$ $cm^{-3}$, and whose parallel opposite planes are cut perpendicular to the direction [111] of the germanium crystal, as seen in FIG. 4a. To the (111) planes of the germanium bulk are attached, by an alloying method using SnSb, a pair of electrodes 42, which are in turn provided with corresponding lead wires 43. The thus prepared specimen is immersed in liquid helium at 4.2°K contained in a DEWAR FLASK 44, as seen in FIG. 4b. Through the electrodes 42 to the germanium bulk 41 is applied an electric field over $10^3$ V/cm which is sufficiently intense to excite the conduction electrons up to the hot state (100 V per 1 mm). At the same time, a magnetic field over 70 KG is applied to the bulk 41 in the axial direction thereof (in the direction parallel to the current therethrough) by means of a magnet 45. At this stage, the separation Δ between the energy bands, as seen in FIG. 3b, is about 20°K, and this temperature is much higher than the ambient temperature, that is, the lattice temperature (4.2°K). It has been observed that the current-to-voltage characteristic shows a voltage-controlled type N type negative resistance characteristic by applying an electric field ($V_1$, $V_2$, $V_3$) above a certain value. FIG. 5 shows the characteristic curves of the negative resistance with the applied magnetic field as a parameter. As is known from FIG. 5, the intenser the applied magnetic field B ($B_3 > B_2 > B_1$) becomes, the more remarkable is the negative resistance. The temperature dependence of the current-voltage characteristic of the germanium bulk 41 under the influence of a magnetic field is shown in FIg. 6 ($T_3 > T_2 > T_1$). As is apparent from FIG. 5, with a magnetic field of low intensity the negative resistance characteristic does not stand out and in such a case the separation Δ is in the same order as the ambient temperature of the bulk so that the characteristic is of a current saturation type rather than of a negative resistance. The nonlinearity of the curves is due to Landau quantization by magnetic field. The extension in space of Landau electrons quantized by magnetic field is given by $$l = 80 / \sqrt{B\,(kG)}\ Å .$$

If a condition $\lambda l \approx \omega_c \tau >> 1$ is not satisfied, the effect of such quantization will not grow predominant, where $\lambda$ is the mean free path, $\tau$ is the time of electronic collision and $\omega_c = eB/m^*c$.

The change in the current-voltage characteristic with increasing ambient temperature is shown in FIG. 6. As is seen from the figure, the negative resistance characteristics gradually vanishes with the increase in temperature. This is partially because if the ambient temperature rises, then the time of electronic collision $\tau$ becomes short, the condition $\omega_c \tau >> 1$ no longer holds, and the effect of quantization vanishes, and partially because the separation $\Delta$ between the energy bands having different electronic mobilities becomes not sufficiently great in comparison with the ambient temperature. Therefore, unless the intensity of a magnetic field to be applied is increased with increased ambient temperature, the negative resistance property of the germanium bulk will vanish. The lowermost curve in FIG. 6 shows this state. In FIG. 6, it is assumed that $T_1 < T_2 < T_3$. Since the separation $\Delta$ between the energy bands increases with the increase in the intensity of the applied magnetic field, the intensity of the electric field necessary to excite the electrons up to the conduction band having lower mobility (threshold field) must also be increased with the intensity of the magnetic field. In FIG. 5, $B_1$, $B_2$ and $B_3$ designate the intensities of magnetic field to be applied such that $B_1 < B_2 < B_3$.

Embodiment 2

Figure 1A:
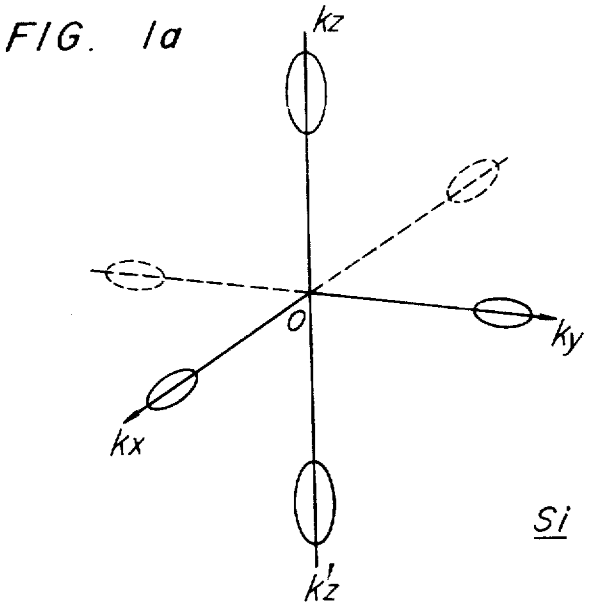
FIGS. 1a and 1b respectively show constant energy ellipsoids in momemtum space of silicon and germanium.
Figure 1B:
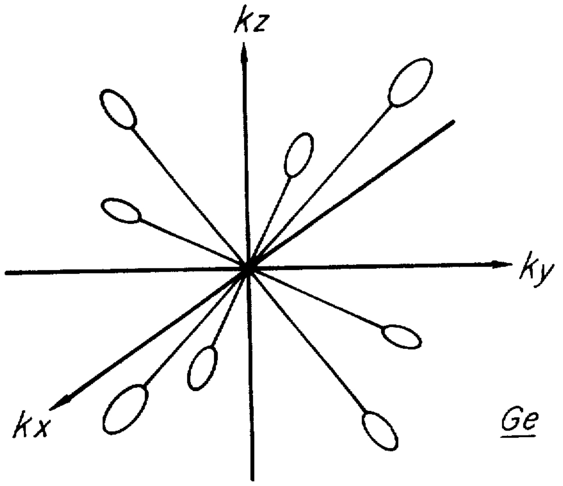
Figure 2:
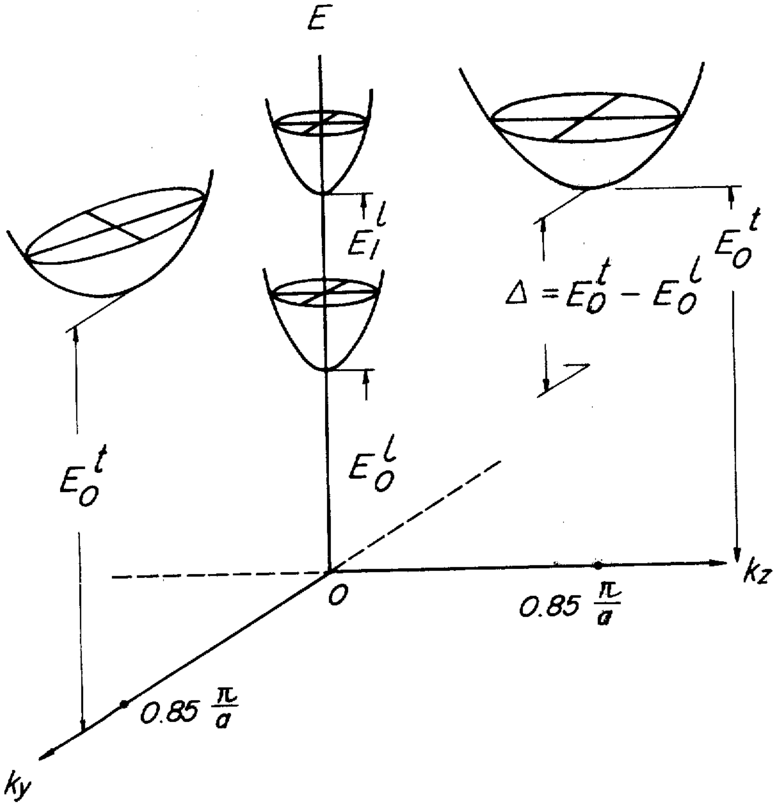
FIG. 2 shows a band structure of electron energy of silicon having a multi-valley structure, quantized by an electric field applied in the direction [100].
Figure 7A:
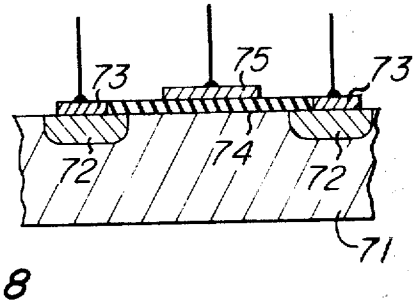
FIG. 7a is a partial cross section of an embodiment of the invention.
Figure 8:
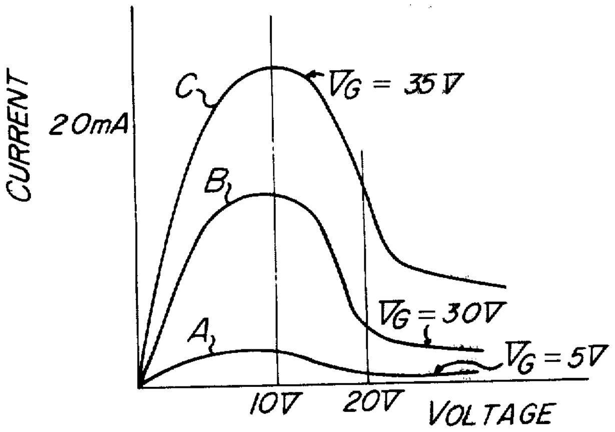
FIG. 8 shows current-voltage characteristics of the embodiment shown in FIG. 7, in which the dependence of the negative resistance characteristic on the voltage applied to the gate of the embodiment is shown.
Figure 7B:
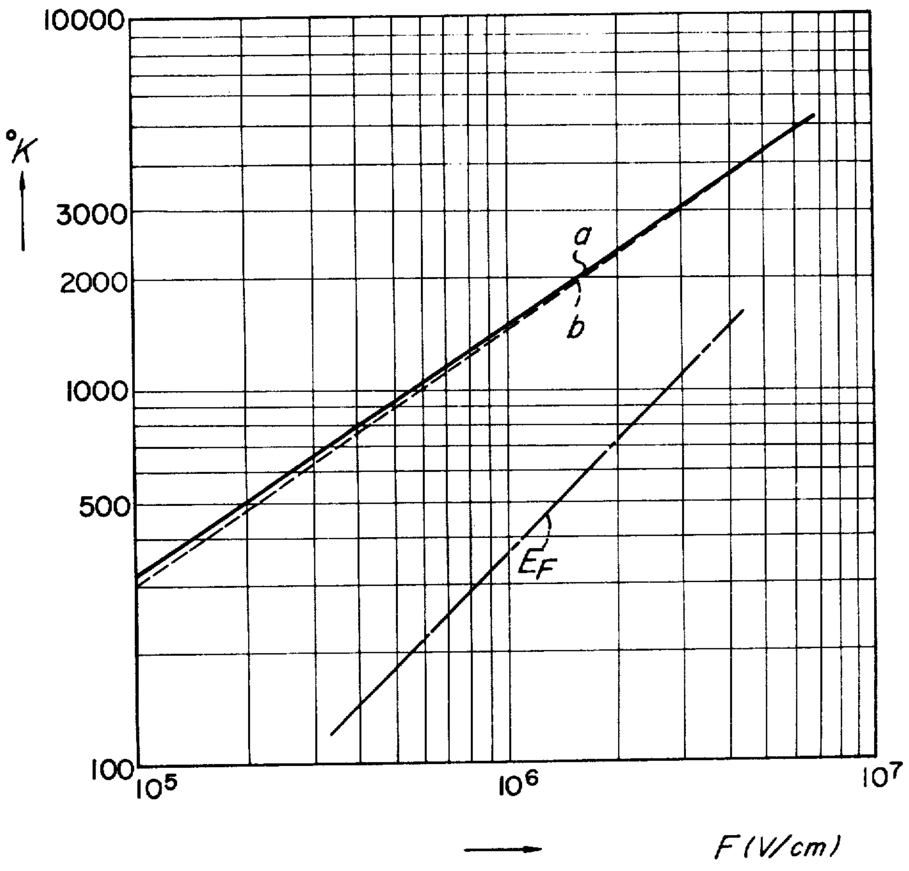
FIG. 7b is a logarithmic plot of the relation between the intensity of the electric field applied to the surface of the silicon bulk and the absolute temperature, in which the state of change in the energy band structure of the bulk is shown.

A p-type silicon substrate 71 having a thickness of 250$\mu$ and a resistivity of 7 Ωcm is prepared which has its principal surface in the (100) plane of the silicon crystal. An area of 1500 $\mu \times$ 500 $\mu$ is defined on the principal surface, which area except its central region 100$\mu$ wide is doped with phosphorus P as impurities at a concentration of $10^{21}$ atoms $cm^{-3}$ to form conductive regions 72 having a thickness of 2$\mu$, as seen in FIG. 7. Aluminum electrodes 73 are disposed on these regions 72 to provide a source and a drain. On the principal surface of the silicon substrate between the source and drain electrodes 73 is formed a $SiO_2$ flim 74 having a thickness of 6,000 A. In the middle portion of the $SiO_2$ film 74 is provided a gate electrode 75. Thus, a field effect transistor is produced. Then, the FET is refrigerated by liquid helium and the source electrode is grounded while the drain electrode and the gate electrode are kept at potentials 10–20 V and 5–100 V, respectively. In this case, the energy splitting ($E_1' - E_0'$), the separation between the energy bands $\Delta = E_0' - E_0'$ and the Fermi energy $E_F$ in a multi-valley structure involved in a silicon substrate (see FIG. 2), respectively, have the relationships as shown by functions of surface field strength F with respect to absolute temperature K in FIG. 15. FIG. 8 shows a current-voltage characteristic of the specimen under these conditions. In this figure, the abscissa is the voltage between the source and the drain measured in volts V, and the ordinate is the source-drain current in milliamperes mA. The curves A, B and C correspond to the characteristics in which the gate voltages are 5, 30, and 35V, respectively.

It is apparent from FIG. 8 that the negative resistance appears within the region where the source-drain voltage ranges from 10 to 20 V and the gate voltage is over 10 V. It may, therefore, be concluded that the negative resistance characteristic can be changed by changing the voltage applied to the gate electrode. As is described above, when a sufficiently high electric field is applied between the gate and the drain, each valley can be separated into sub-bands. The magnitude of this separation can be controlled by the magnitude of the applied gate voltage. Moreover, the experiment made by the inventors showed that the threshold value for the electric field applied between the source and the drain to provide the negative resistance characteristic was about 1 KV/cm. The lower limit to the above mentioned gate voltage, that is 10 V, is so chosen that the separation between the conduction bands in the inversion layer of the p-type silicon substrate may assume a value greater than twice 4.2°K at the same temperature as that of liquid helium. Hence, it should be recognized that if it is required to operate the FET (i.e. Field Effect Transistor) at room temperatures, the higher voltage is to be applied to the gate electrode.

Embodiment 3

Figure 9:
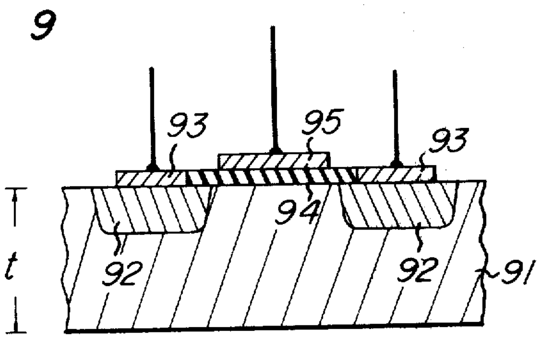
FIG. 9 is a partial cross section of another embodiment of the invention.

In this embodiment, an n-type silicon substrate 91 whose resistivity at room temperatures is sufficiently high, i.e. at least 50 Ω, is used, although in the embodiment 2 a p-type silicon substrate is employed. Reference should be made to FIG. 9 for a better understanding of this embodiment. Here, the voltage applied to the gate electrode is 5 to 100 V, and the electric field applied between the source and the drain is of the order of 1KV/cm similar to Embodiment 2. The substrate has its principal surface coincident with the (100) plane of the silicon crystal. On the middle portion of the principal surface is provided an $SiO_2$ or $SiO_2$—$Al_2O_3$ film 94 on which a gate electrode 95 is disposed. The n-type silicon substrate 91, except its region coated with the film 94, is doped with phosphorus atoms at a concentration of $10^{18}$ atoms/$cm^3$ to form $n^+$ -regions 92. On the $n^+$ regions thus formed are disposed source and drain electrodes 93. Thus, in the same manner as in the embodiment 2, a negative resistance device can be produced.

If, in this device, a positive voltage $V_G$ is applied to the gate electrode, a positive voltage to the source electrode, and a negative voltage to the drain electrode, then a current-voltage characteristic due to negative resistance phenomenon similar to that associated with the device of the embodiment 2 can be observed. In this case, however, a geometrical restriction has to be imposed upon the silicon substrate such that $nt << n_s$ ($cm^{-2}$, surface electron density), where $t$ is the thickness of the substrate in cm and n is the electron density in the substrate in $cm^{-3}$. For example, if $n_s \approx 10^{12}$ $cm^{-2}$ ($V_G$ : 6 V, dox : 3,000 A), then the electron density of a substrate having a thickness of 50 $\mu$ must be less than $2 \times 10^{14}$ $cm^{-3}$. In order to keep the voltage drop through the n-type silicon substrate in this embodiment as small as possible and to effectively apply an electric field only to the accumulation layer, it is preferable to reduce the thickness of the substrate to an attainable limit.

Embodiment 4

Figure 10:
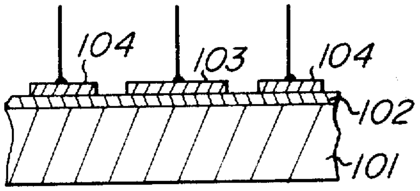
FIG. 10 is a partial cross section of a still another embodiment of the invention.
Figure 11:
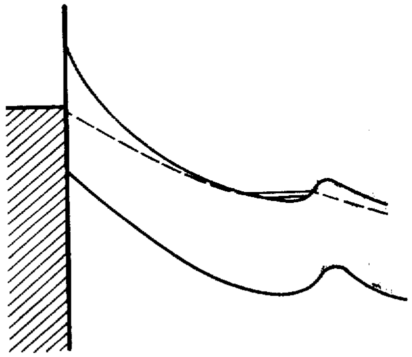
FIG. 11 shows an energy band structure associated with one embodiment of the invention.

A p-type silicon substrate 101 having a resistivity higher than 20 Ω.cm and its principal surface coincident with the (100) plane of the silicon crystal is prepared, as seen in FIG. 10. An As-doped n-type silicon layer 102 having a thickness of 6,000 Å is formed on the principal surface of the substrate 101 by an epitaxial growth technique in which $SiCl_3$ gas mixed with $AsCl_3$ gas is reduced in a furnace with $H_2$ gas.

Figure 12:
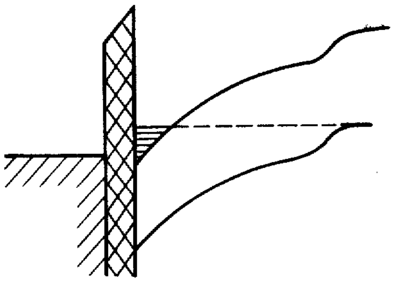
FIG. 12 shows an energy band structure associated with another embodiment of the invention.

In the central portion of the n-type silicon layer 102 is disposed through high vacuum electron beam evaporation at less than $10^{-7}$ Torr. an MOS electrode (in this specification, MOS indicates a triple layer such as a Metal-Oxide-Semiconductor layer and hereinafter referred to as such) Pt 103. Aluminum films 104 are formed through vacuum-deposition on the n-type layer 102 except the region on which the MOS electrode is disposed, an appropriate space being left between the deposited aluminum film 104 and the MOS electrode 103. The aluminum film 104 is then subjected to heat treatment at 400°C for 10 minutes to form ohmic contacts which serve as source and drain electrodes 104. Thus, an epitaxial layer field effect transistor is produced. This epitaxial layer field effect transistor is operated by applying a voltage of −100 V to the substrate via the gate electrode 103. In this embodiment, the n-type silicon substrate may be replaced by a p-type silicon substrate having a resistivity of higher than 500 Ω cm or a hetero-junction substrate. In such a case, it is preferable to increase the effect of confining charge carriers (by utilizing a potential barrier due to the hetero-junction) that a semiconductor whose forbidden band width is greater than that of silicon, such as Cr-doped GaAs should be used. It is also effective to use a MOS gate instead of Schottky configuration and to apply a large negative potential to the gate. FIG. 12 shows an energy band structure of a quantized electric field effect transistor. This transistor is produced by the following steps. A thin n-type epitaxial layer having a thickness of 5,000 Å or less is first formed on a semi conductive silicon substrate having a resistivity of higher than 100 Ω cm. An $SiO_2$ film is then formed on the epitaxial layer by thermal oxidation method to reduce the thickness of the epitaxial layer proper to 500 Å or less. And finally, aluminum is vacuum deposited on the $SiO_2$ film to form a gate electrode. In each of these transistors obtained, the negative resistance characteristic can be observed by applying a sufficiently intense electric field ( $\gtrsim 10^3$ V/cm) between source and drain.

Embodiment 5

Figure 13A:
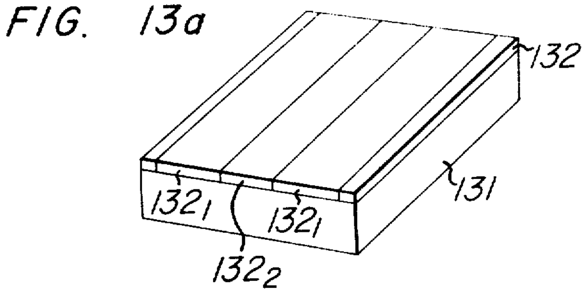
FIGS. 13a through 13c show the manufacturing processes of the negative resistance device according to the invention.
Figure 13B:
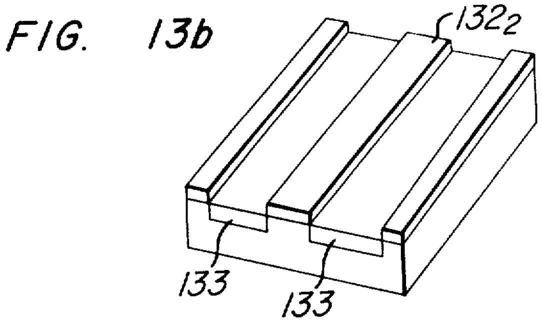
Figure 13C:
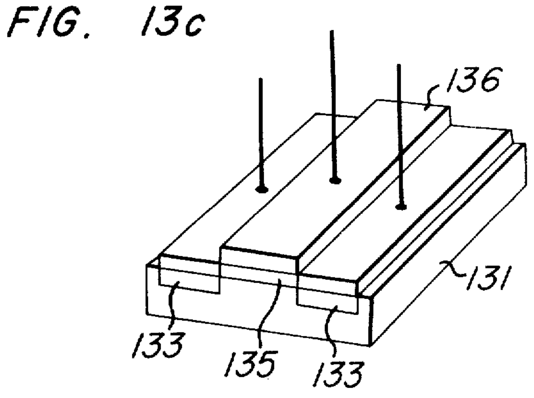
Figure 13D:
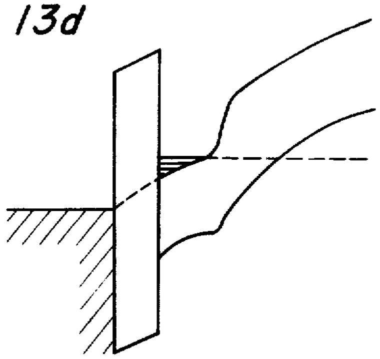
FIG. 13d shows an energy band structure of a still another embodiment of the invention.

As seen in FIG. 13*a*, an aluminum mask 132, 1 to 2 microns thick, is disposed on the surface of a p-type silicon substrate 131 having a resistivity of higher than 50 Ω cm. Thereafter, a predetermined portion of the mask 132, for example, such as a portion $132_1$ is removed by photoetching so that $P^+$ ions or $As^+$ ions are injected into the portion of the substrate, where the mask portion $132_1$ has been removed, at a high concentration by means of an ion accelerator of the maximum capacity 200 KeV. Thus, a deep $n^+$ layer 133 is formed, as seen in FIG. 13*b*. An n-channel P is also formed in the substrate beneath the portion $132_2$ at the depth from 100 to 500 Å due to ions shot into the substrate by an accelerator. Then, the mask portion $132_2$ is removed, an insulating oxide film 135 of $SiO_2$ or $SiO_2—Al_2O_3$ is provided on the portion of the substrate surface where the aluminum mask portion $132_2$ is removed, and an electrode 136 is disposed on the oxide film 135, as seen in FIG. 13*c*. On the $n^+$ layer 133 are provided a source electrode and a drain electrode.

According to another recommendable method, the steps of fabrication are as follows. $P^+$ ions from a source of $PH_3$ in plasma state are driven into the surface of the silicon substrate coincident with the (100) plane of the silicon crystal up to depth of 1,500 Å under acceleration in an electric field of 100 KeV so that an n-type layer at any desired doping concentration may be formed. Then, the part of the n-type layer up to a depth of 1,300 Å from its surface is turned to $SiO_2$ by thermal oxidation in air at 900°C. The remaining part of the n-type layer having its thickness reduced to 200 Å serves as a channel. With a high potential impressed on the $SiO_2$ layer via a gate electrode disposed thereon, the channel is quantized since it is very thin although it is doped with impurities at a high concentration. Therefore, if a source and a drain are provided along the surface, the negative resistance characteristic is observed with respect to the current flowing between the source and drain. FIG. 13 *d* shows an energy band structure associated with this embodiment.

Embodiment 6

Figure 14A:
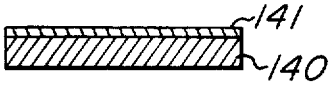
FIG. 14a is a partial cross section of a further embodiment of the invention.
Figure 14B:
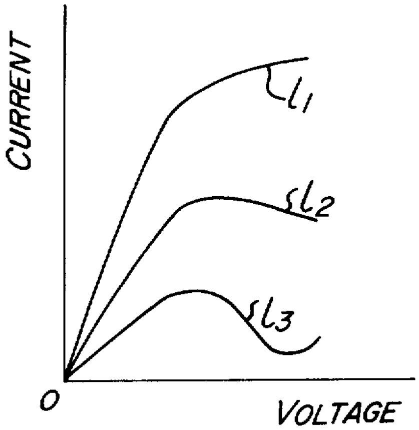
FIG. 14b shows current-voltage characteristics of the device shown in FIG. 14a for various thicknesses of epitaxial layers formed in the device.

The direction of the crystal growth of Bi epitaxially grown by sputtering on the surface of a NaCl crystal coincident with its (100) plane will coincide with the two-fold rotation axis of bismuth Bi. This state is shown in FIG. 14*a*. If the thickness of the thus formed epitaxial layer 141 is in the order of 100 to 200 Å, the motion of electrons along the direction of the thickness can be quantized. In this case, the separation Δ between the energy bands of Bi having different electron mobilities will be about 0.1 eV so that the device as shown in FIG. 14*a* exhibits a negative resistance characteristic at room temperatures. The current-voltage characteristic curves $l_1$, $l_2$, $l_3$ in FIG. 14*b* correspond to the cases where the thickness of the Bi epitaxial layer is 1,000 Å, 500 Å, and 100 Å, respectively. No negative resistance characteristic is developed where the thickness is 1,000 Å. In this embodiment, no electric or magnetic field need be applied in the direction of the thickness of the epitaxial layer so that there is resulted in a disadvantage that the quantization of the motion of electrons cannot be externally controlled. In other words, the separation Δ between the energy bands is constant and cannot be changed if the thickness of the epitaxial layer is constant. In this embodiment, it is required that the condition $$\lambda >> l$$

should hold, where λ is mean free path of an electron and $l$ is the thickness of the crystal, and that the specimen should be homogeneous in lattice space.

Embodiment 7

A p. GaAs substrate which has its principal surface coincident with the (100) plane of the p. GaAs crystal is prepared, and the substrate is subjected to the same processes of fabrication as in the embodiment 1. As shown in FIG. 3*b* the thus fabricated element is further placed under the same condition as in the embodiment 1, and the separations occur in the main conduction band (hereinafter referred to as Γ band) located at the crystallographic Γ point and in the subordinate conduction band (hereinafter referred to as L band) located at the L point of Brillouin zone. Since the effective mass of an electron in the L band is very great, the separation in this band is slight. On the other hand, the separation in the Γ band is large and it is given by $$\left\{ 4170 - 2670 \times (F/10^6)^{2/3} \right\} K,$$

where $F$ is the electric field applied in V/cm. This is small in comparison with the case where the gate voltage vanishes. For this reason, it is possible to decrease the threshold voltage for Gunn diode in MIS configuration to start oscillation or amplification by applying a gating voltage or to easily change the oscillation output or amplification gain by controlling the number of electrons in the inversion layer.

If there is any non-homogeniety of the magnetic field in the specimen of the embodiment 1, the separation Δ between the energy bands will take different values in places due to the disorder in the field so that the effect of the quantization of the electron motion on the conductivity will become less remarkable.

Therefore, the homogeneity of the magnetic field is an essential requirement. The degree of homogeneity must be such that $$\frac{\langle(\Delta B)^2\rangle^{1/2}}{B} \leq 10^{-1}$$

where $B$ is the intensity of the magnetic field.

In the case of quantization by an electric field, a similar requirement must be introduced. In the embodiment employing an MOS inversion layer, the gating voltage of quantization $V_G$ is applied between the gate and the drain electrodes. Meanwhile, a voltage $V_{SD}$ is applied between the source and the drain electrodes for the purpose of intense field drift conduction electrons. In order to make the effective value of the electric field in the inversion layer uniform over the entire channel, the condition $V_G >> V_{SD}$ is preferably satisfied. In general, the thickness of the gate insulation layer is of a uniform value $d_{ox}$, while the channel length L is such that $L >> d_{ox}$ since $L \sim 100\ \mu$ and $d_{ox} \sim 3{,}000$ A. Therefore, in order to achieve the uniform quantization of the electron motion in the channel, it is required either to make the gate insulation layer as thick as possible and the gate voltage $V_G$ higher or to render the channel as short as possible and the voltage $V_{SD}$ lower.

Also, the same is true of the case of quantization due to the geometrical restriction on the motion of electrons. The thickness of the active region must be uniform and the degree of non-uniformity should be kept within 5 percent.

In short, the feature of the present invention described above is to create the negative resistance property by some external influences.

Figure 15:
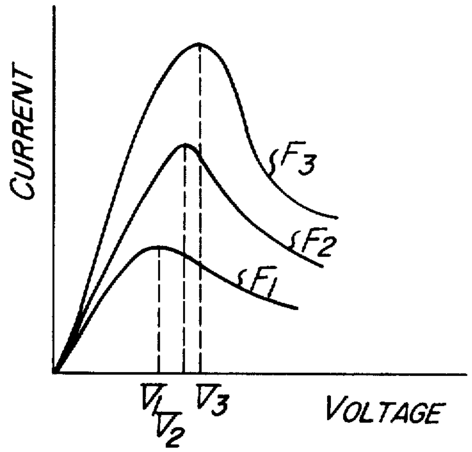
FIG. 15 shows current-voltage characteristics of a negative resistance device according to the invention for various quantizing electric fields.

It is, therefore, apparent that the negative resistance characteristic can be changed or controlled by changing the amount of the external influences. This state is shown in FIGS. 5 and 15. In FIG. 15, $F_1$, $F_2$, and $F_3$ indicate the intensities of the gate field due to applied gate voltage such that $F_1 < F_2 < F_3$. In general, the negative resistance characteristic does not stand out if the intensity of applied electric or magnetic field to quantize the motion of electrons is low, but the characteristic is improved by increasing the intensity. When a magnetic field is used, the characteristic is continuously improved with the increase in the intensity of the applied field. On the other hand, when an electric field is employed, the characteristic experiences a deterioration at an extremely high intensity, since there are produced space charges due to the too high field. For example, with an MOS inversion layer which is a $SiO_2$ film formed up to a depth of 5,000 A in the surface of a silicon substrate coincident with the (100) crystallographic plane, such a deterioration first appears for the value of $V_G$ approximately equal to 5 KV.

If a uniaxial pressure is applied between the gate electrode on the MOS (i.e. Metal Oxide Surface) inversion layer formed in the (100) plane of a silicon substrate and the substrate, the separation Δ increases to thereby improve the negative resistance characteristic. Now, if the gate electric field $E \sim 10^6$ V/cm and a strain $\Delta t/t$ (1,700 Kg/cm²)$\sim 10^{-3}$ (t is the thickness of the used substrate), then the total effect by the gate field and the strain is equal to 1.3 times the effect by the field alone. This effect due to pressure is not so remarkable and it will be much easier to control the negative resistance characteristic by changing the gate voltage or the magnetic field intensity. According to the report by J. C. McGroddy in "Proceedings of International Conference on Semiconductor Physics", (Moscow in 1968) P. 950, such an effect of pressure on a Ge or Si bulk is a bulk effect based on the principal that the symmetry of the energy bands of multi-valley structure is degraded by the application of a pressure so that the energy bands are mutually biased.

On the other hand, in the present invention, the effect of pressure is on particular energy bands produced through quantization of the motion of electrons due to an electric field, a magnetic field or a geometrical restriction, but not on the energy bands characteristic of the used semiconductor bulk.

Figure 16:
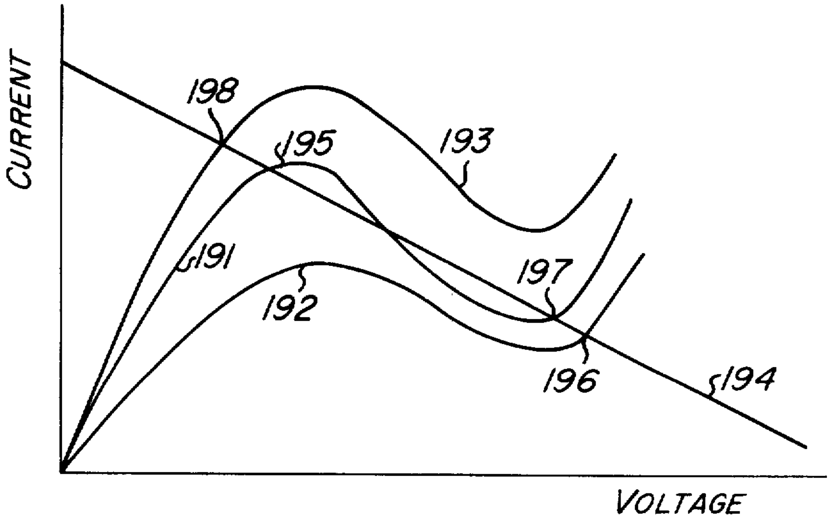
FIG. 16 shows current-voltage characteristics of the MOS inversion layer of a negative resistance device of the invention for various intensities of light illumination.

Also, the negative resistance characteristic can be controlled by light irradiation. FIG. 16 shows current-voltage characteristics of a MOSFET fabricated according to the processes of the embodiment 2, which characteristics are obtained by projecting on the active portion of the MOSFET a light having energy equal to the separation Δ between the quantized energy bands of the p-type silicon substrate (usually equal to energy which infrared rays having wave length of tens of microns possesses). The curve 191 is for the irradiation by infrared rays, while the curve 192 is for the irradiation by lower frequency infrared rays. The sensitivity to the wave length of the outer or lower frequency infrared rays will somewhat change but this change is negligible in this case. In FIG. 16 a load line is indicated at numeral 194. The operating point at a position 195 under no irradiation will shift to a position 196 when outer infrared rays are irradiated and remain at a position 197 after the irradiation is interrupted. This is a switching operation due to the irradiation by outer infrared rays.

In order to return the operating point from the position 197 to the position 195, the following two steps are required. First, inner infrared rays (11,260 A) which can excite electrons in the valance band of silicon up to the conduction band are irradiated so that the available characteristic may be given by the curve 193 and that the operating point may rest in a position 198. Secondly, the irradiation is interrupted so that the available characteristic may follow the curve 191 and that the operating point may return to the position 195.

The negative resistance device made according to the present invention is different from a two-terminal element such as Gunn diode and the negative resistance characteristic of this device can easily controlled by controlling the voltage applied to the third electrode, i.e. gate electrode.

Moreover, even in a thin film configuration, an extremely intense electric field such that $nl \geq 10^{12}$ cm$^{-2}$, as is the case with the bulk of a Gunn diode, will not occur under such a condition that $$Ns \leq 5 \times 10^{12} \text{ cm}^{-2},$$

where Ns is the surface electron density of, for example, silicon, the gate voltage being below 140 V when the thickness of the $SiO_2$ insulation film is 5,000 A.

Thus, the present invention is characterized in that the oscillation frequency or frequency to be amplified is determined by an external circuit, while the oscillation frequency of a Gunn diode comprising a GaAs crystal with such a condition that $nl \gtrsim 10^{12}$ cm$^{-2}$ is uniquely determined depending upon the length of the crystal. If the gate voltage higher than 140V is applied, there will be caused high field domains (one or more region in which the electric field is extremely intense). And this phenomenon can be utilized to provide digital devices.

What is claimed is:

1. A negative resistance device comprising:

a body of material having multi-valley energy bands, wherein at least two valleys are degenerate in energy; and means for converting said degenerate valleys into non-degenerate valleys, with the separation from the bottom of a high-energy valley to the bottom of a low energy valley exceeding the thermal energy corresponding to the ambient temperature of the material of said body by a predetermined amount, so that the mobility of an electron in a lower energy valley is substantially greater than the mobility of an electron in a higher energy valley, said means for converting said degenerate valleys into non-degenerate valleys comprising means for applying a magnetic field to said body of material in a direction in lattice space corresponding to a direction in the pseudomomentum space of the body of material, said direction in pseudomomentum space being non-symmetrically disposed with respect to said at least two valleys, said magnetic field being sufficiently intense as to split each of said two valleys into separate Landau levels, the lowest Landau level of one valley being higher in energy then the lowest Landau level of the other valley by an amount equal to said separation, and means for applying an electric field to said body in a direction parallel to said magnetic field, the current through said body as a result of said electric field decreasing with increasing applied electric field due to an electron transfer from said lower energy valley to said higher energy valley to produce a negative resistance characteristic.

2. A negative resistance device comprising:

a body of material having multi-valley energy bands, wherein at least two valleys are degenerate; and means for converting said degenerate valleys into non-degenerate valleys, with the separation from the bottom of a high-energy valley to the bottom of a low energy valley exceeding the thermal energy corresponding to the ambient temperature of the material of said body by a predetermined amount, so as to make the mobility of an electron in a lower energy band high and the mobility in a higher energy band low, wherein said converting means comprises means for applying a magnetic field to said body of material in a direction in lattice space corresponding to a direction in the pseudomomentum space of the body of material, said direction in pseudomomentum space being non-symmetrically disposed with respect to said at least two valleys, said magnetic field being sufficiently intense to provide said valley separation, and means, coupled to a pair of opposite surfaces of said body of material, for applying an electric field sufficiently intense that said body will exhibit a negative resistance characteristic.

3. A negative resistance device according to claim 2, further including means for modulating said magnetic field to control the amount of said valley separation, whereby the negative resistance exhibited by said device is controllably adjustable.

4. A negative resistance device as claimed in claim 2, wherein said material is one selected from a group consisting of Ge, Si, GaAs and semi-metals.

5. A negative resistance device as claimed in claim 2, further comprising a means for controlling the degree of said separation by applying in a controllable manner an external magnetic field parallel to said electric field to said material.

6. A negative resistance device as claimed in claim 5, wherein said material is one selected from a group consisting of Ge, Si GaAs and semi-metals.

7. A negative resistance device according to claim 5, wherein said body of material is a bulk germanium crystal having said pair of opposite surfaces disposed in planes substantially perpendicular to the [111] direction, with a pair of respective electrodes attached thereto for effecting the application of said electric field to said bulk.

* * * * *